(12) United States Patent  
Chen

(10) Patent No.: US 6,940,301 B2  
(45) Date of Patent: Sep. 6, 2005

(54) TEST PAD ARRAY FOR CONTACT RESISTANCE MEASURING OF ACF BONDS ON A LIQUID CRYSTAL DISPLAY PANEL

(75) Inventor: Hui-Chang Chen, Kaohsiung (TW)

(73) Assignee: Au Optronics Corporation, (TW)

( * ) Notice: Subject to any disclaimer, the term of this patent is extended or adjusted under 35 U.S.C. 154(b) by 65 days.

(21) Appl. No.: 10/734,371

(22) Filed: Dec. 12, 2003

(65) Prior Publication Data

US 2005/0127936 A1 Jun. 16, 2005

(51) Int. Cl.[7] ........................................... G01R 31/00
(52) U.S. Cl. ..................... 324/770; 349/149
(58) Field of Search .............. 324/500, 765, 324/770, 158.1; 349/54, 86, 149; 438/14, 438/17–18; 345/30, 32, 55, 204–206

(56) References Cited

U.S. PATENT DOCUMENTS

| | | | |
|---|---|---|---|
| 5,726,726 A | 3/1998 | Nakanishi | |
| 5,748,179 A * | 5/1998 | Ito et al. | ...................... 349/152 |
| 6,031,590 A | 2/2000 | Kim | |
| 6,061,246 A | 5/2000 | Oh et al. | |
| 6,344,754 B1 | 2/2002 | Tamani | |
| 6,590,624 B1 | 7/2003 | Lee | |
| 6,600,543 B1 | 7/2003 | Lee et al. | |
| 6,777,973 B2 * | 8/2004 | Morishita | ................... 324/770 |

* cited by examiner

Primary Examiner—Minh N. Tang  
(74) Attorney, Agent, or Firm—Duane Morris LLP

(57) ABSTRACT

A test pad array and dummy lead array for measuring anisotropic conductive film bond contact resistance on a liquid crystal display panel. The test pad and dummy lead arrays are provided on a surface of the liquid crystal display panel. The test pad array is electrically connected to a group of terminal pads disposed on the surface of the panel, which are electrically connected to an electronic device with anisotropic conductive film bonds. The test pad array allows the contact resistance of one or more of the anisotropic conductive film bonds to be measured on the panel. The dummy lead array is provided for electrically connecting a second electronic device to the panel. The dummy lead array is electrically connected to the test pad array such that a contact resistance of at least one anisotropic conductive film bond associated with the second electronic device can be measured on the panel using portions of the test pad array electrically connected to the dummy lead array.

16 Claims, 9 Drawing Sheets

# TEST PAD ARRAY FOR CONTACT RESISTANCE MEASURING OF ACF BONDS ON A LIQUID CRYSTAL DISPLAY PANEL

FIELD OF THE INVENTION

This invention relates to liquid crystal display (LCD) panels. More particularly, this invention relates to anisotropic conductive film contact resistance measuring on an LCD panel.

BACKGROUND OF THE INVENTION

Flat panel display devices commonly use LCD panels. An LCD panel may include a pixel region having an array of pixel thin film transistors and intersecting arrays of spaced apart data lines and gate lines that are connected to the array of pixel thin film transistors. The array of pixel thin film transistors, data lines and gate lines form an array of addressable pixels. The LCD panel may also include a peripheral region associated with driver integrated circuit chips (ICs), which drive the array of pixel thin film transistors. The ICs may be mounted to the LCD panel in the peripheral region thereof using a chip-on-glass (COG), a tape-carrier-package (TCP) or a chip-on-film (COF) technology. In COG, TCP, and COF, anisotropic conductive films (ACFs) are used to bond the driver ICs or the flexible printed circuits or other films which carry driver ICs to the LCD panel.

It is desirable to inspect the electronic aspects of LCD panels and archive ACF bonding conditions. Presently, however, there is no convenient method for measuring the contact resistance of the ACF bonds directly on the LCD panels. Accordingly, a method is needed which allows the contact resistance of the ACF bonds to be measured on the LCD panels.

SUMMARY OF THE INVENTION

A test pad array is disclosed for measuring anisotropic conductive film bond contact resistance on a liquid crystal display panel. The test pad array is provided on a surface of the liquid crystal display panel. The test pad array is electrically connected to a group of terminal pads disposed on the surface of the panel, which are electrically connected to an electronic device with anisotropic conductive film bonds. The test pad array allows the contact resistance of one or more of the anisotropic conductive film bonds to be measured on the panel.

In addition, a dummy lead array is disclosed for measuring anisotropic conductive film bond contact resistance on a liquid crystal display panel. The dummy lead array is provided on the surface of the liquid crystal display panel, for electrically connecting a second electronic device to the panel. The dummy lead array is electrically connected to the test pad array, such that a contact resistance of at least one anisotropic conductive film bond associated with the second electronic device can be measured on the panel using portions of the test pad array electrically connected to the dummy lead array.

DETAILED DESCRIPTION OF THE INVENTION

The present invention is a test pad array for contact resistance measuring of anisotropic conductive film (ACF) bonds, on a liquid-crystal-display (LCD) panel. The contact resistance measurements can be used for archiving different bonding process conditions. The test pad array also allows for electronic character testing and improves ACF adhesion to the panel after the test pad array has been utilized to perform resistance and character testing.

Figure 1A:
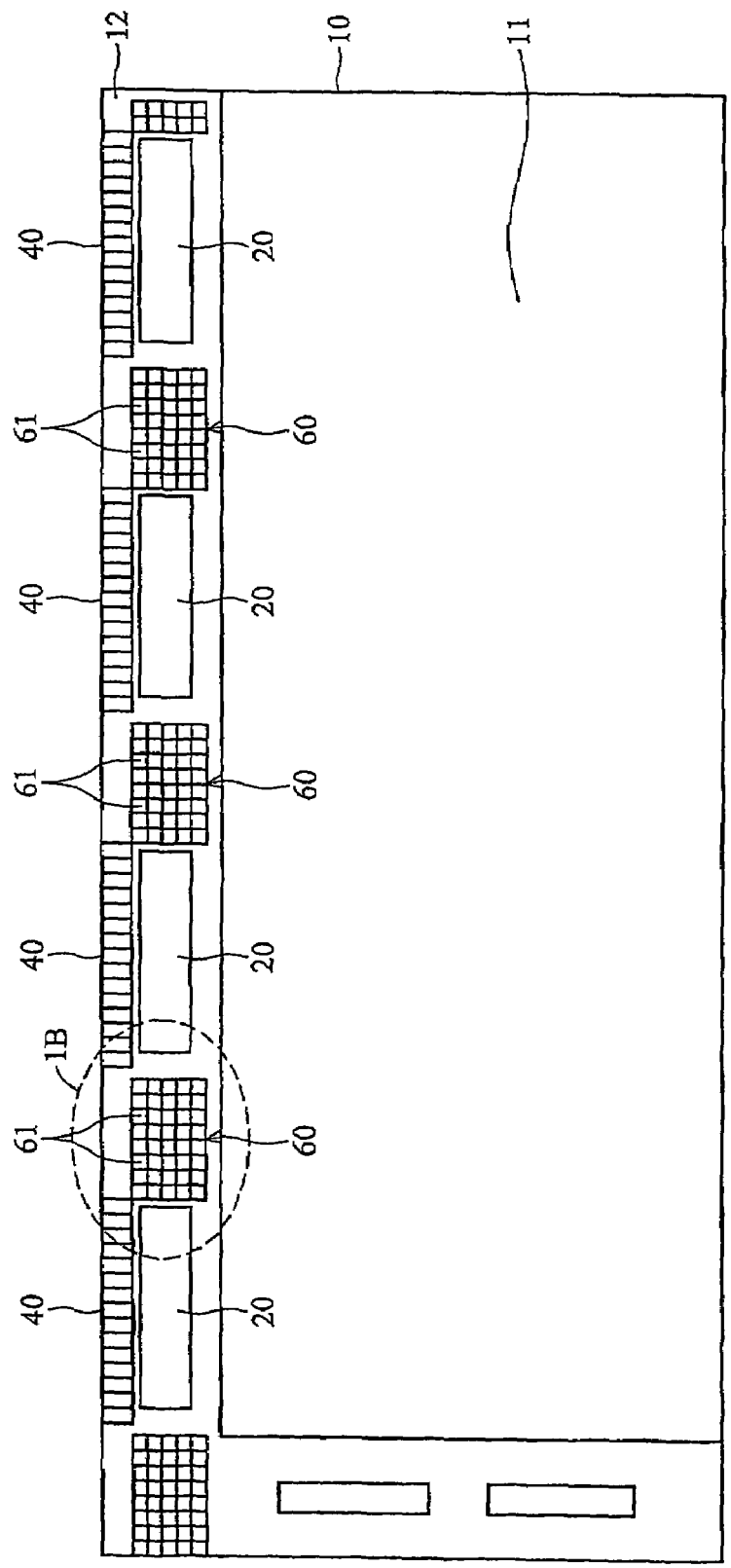
FIG. 1A is a plan view of an illustrative embodiment of an LCD panel which utilizes a test pad array.

FIG. 1A is a plan view of an illustrative embodiment of an LCD panel 10 with chip-on-glass (COG) bonded driver integrated circuit chips (ICs) 20. The panel 10, which may be made from glass or quartz substrate, includes a pixel region 11 and a peripheral region 12. The pixel region 11 includes a pixel thin film transistor (TFT) array and electrically conductive gate and data lines connected to the TFT array. The design of the pixel TFT array and the gate and data lines is well known to persons of ordinary skill in the art and need not be described further herein. A color filter substrate 30 (FIG. 3) may also be provided on the pixel region 11. The peripheral region 12 includes one or more of the driver ICs 20 COG bonded thereon and one or more terminal lead arrays 40 formed thereon for electrically connecting flexible printed circuits (FPCs). The driver ICs 20 are conventionally connected to the TFT array by the gate or data lines extending between the peripheral region 12 and pixel region 11 of the panel 10. The gate or data lines associated with the peripheral region 12 are conventionally terminated with electrically conductive pads 14 (FIG. 4), i.e., terminal pads, disposed on a surface of the peripheral region 12.

Figure 2A:
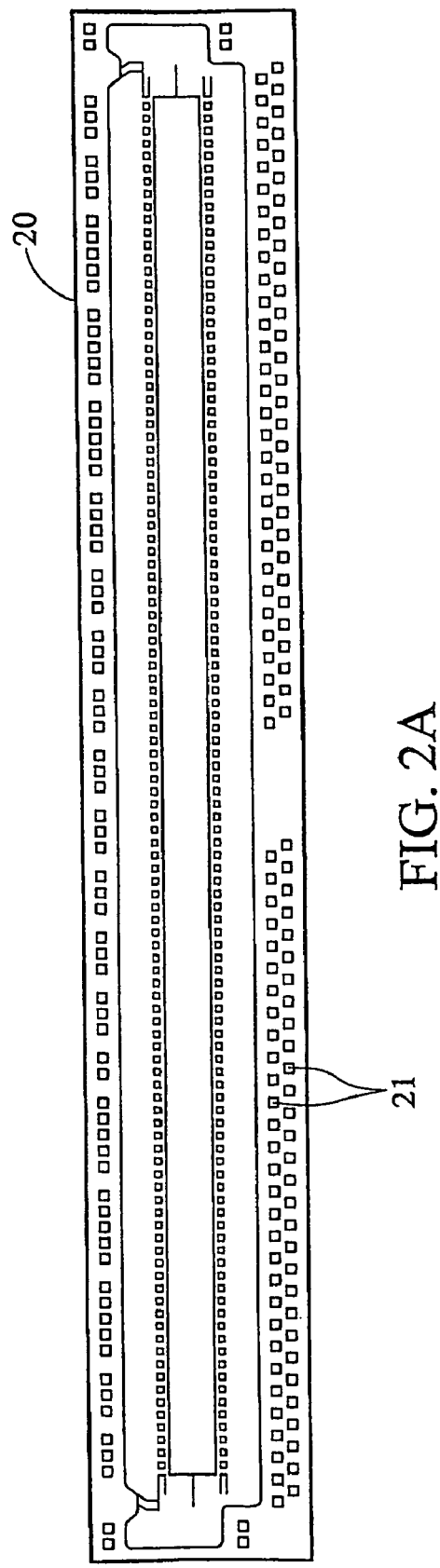
FIG. 2A is a bottom plan view of an exemplary driver IC showing one or more electrically conductive electrodes of the IC.
Figure 2B:
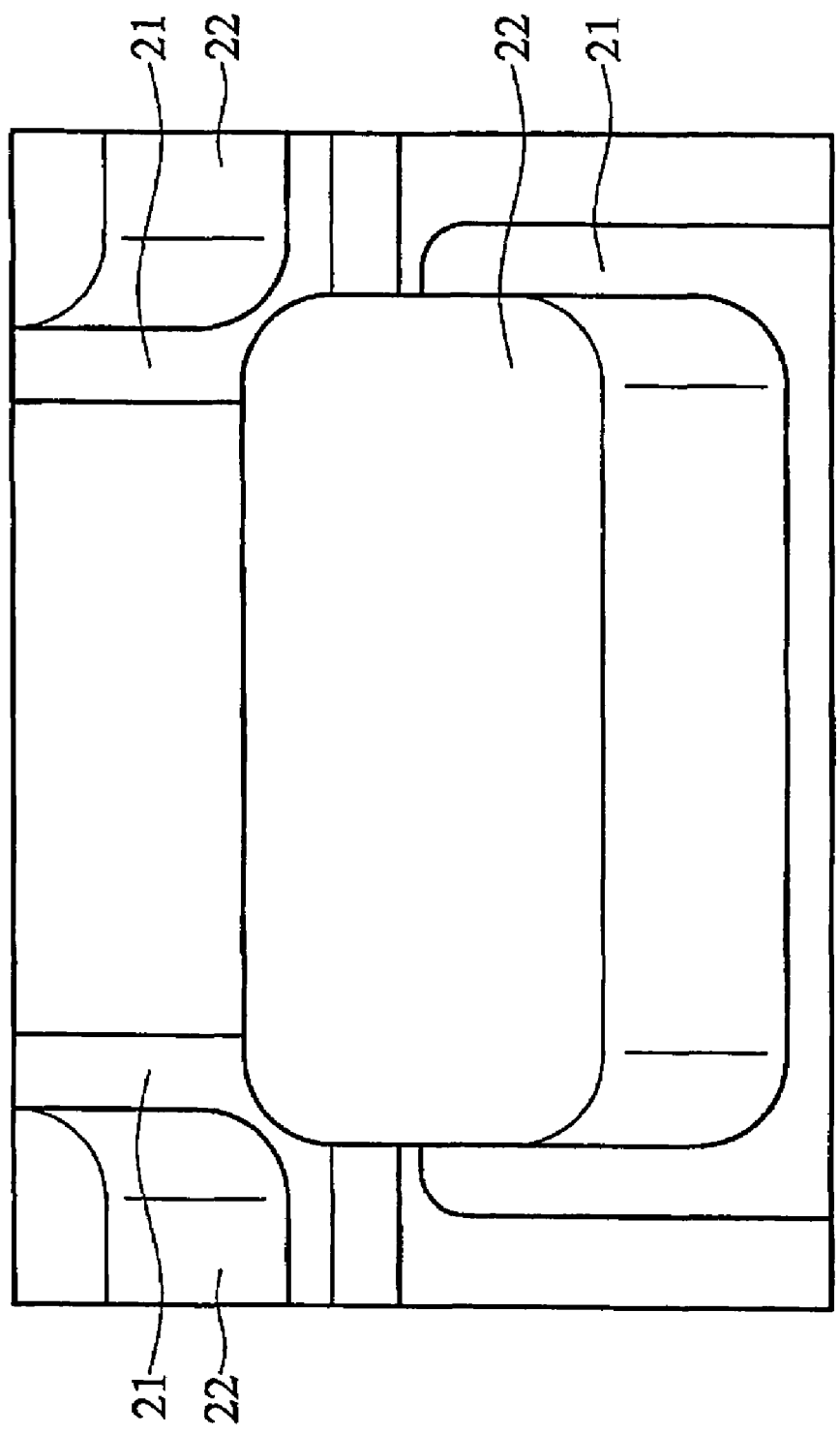
FIG. 2B is an enlarged perspective view of a bump extending from one of electrodes shown in FIG. 2A.

FIG. 2A is a bottom plan view of an exemplary driver IC 20. The IC 20 may include one or more electrically conductive electrodes 21. As shown in the enlarged perspective view of FIG. 2B, a bump 22, made of an electrically conductive material, such as gold, may extend from each of the electrodes 21.

Figure 3:
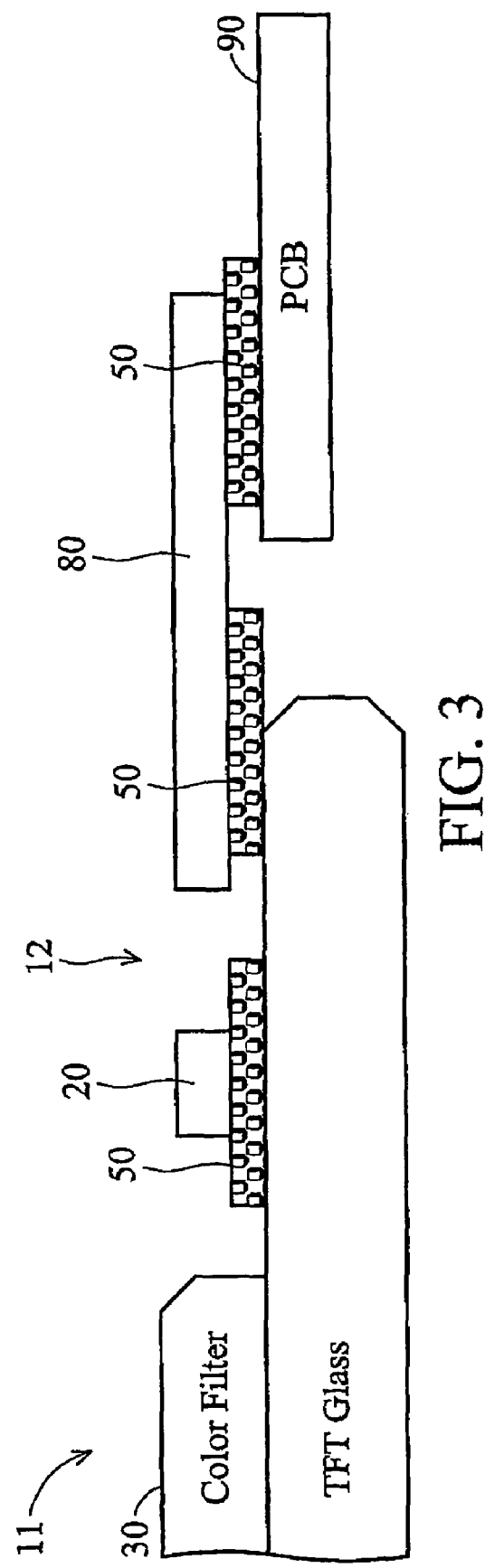
FIG. 3 is a side elevational view of a section of the LCD panel of FIG. 1A with a flexible printed circuit electrically connected thereto.
Figure 4:
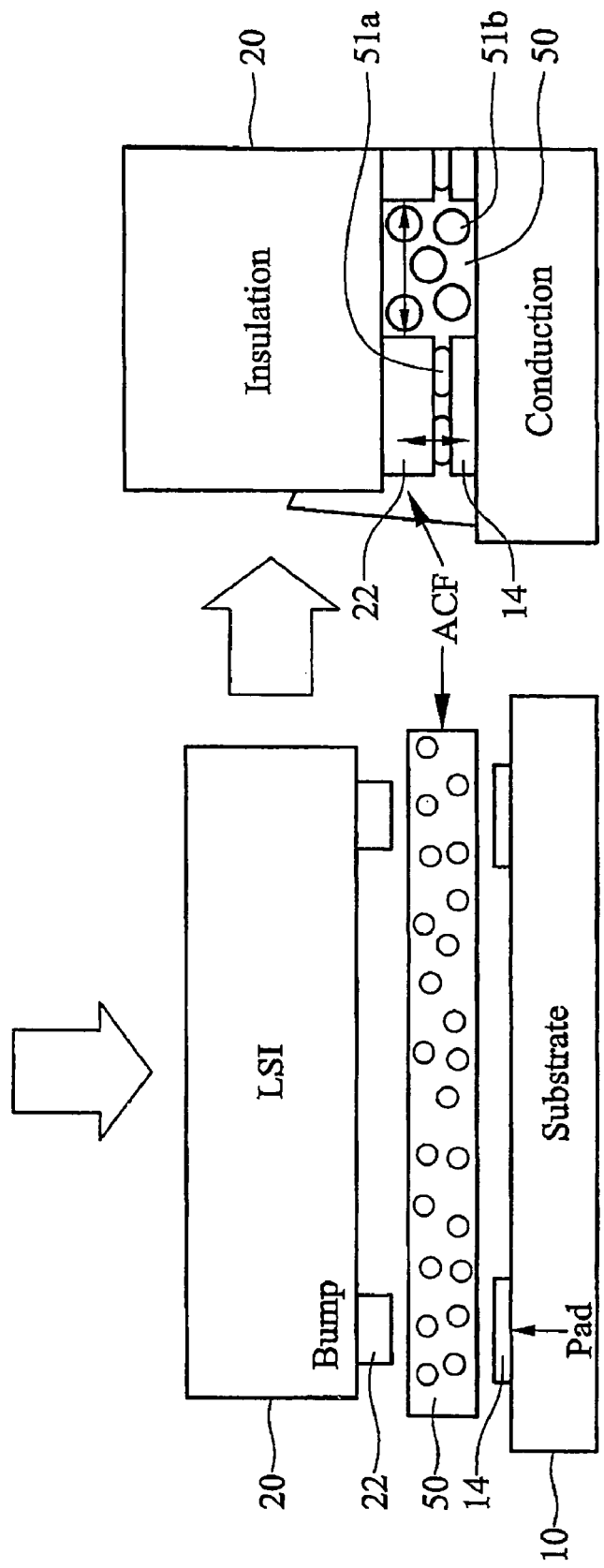
FIG. 4 is a elevational view illustrating the principles of ACF bonding.

As depicted in the side elevational view of FIG. 3, the COG bonding technique utilizes an ACF 50, which comprises a plurality of conductive spheres dispersed in an adhesive resin. The adhesive resin in the ACF 50 adhesively bonds the driver IC 20 to the panel 10 and the conductive spheres in the ACF electrically connects the bumps 22 of the IC 20 with the terminal pads 14. As illustrated in FIG. 4, the COG bonding process involves compressing the driver IC 20 and the panel 10 together. The ACF 50 is then heated to approximately 120° C. to cure or harden the resin component of the ACF 50, so that the IC 20 adheres to the panel 10. The conductive spheres 51a that are located between the bumps 22 and the underlying terminal pads 14 are subjected to compressive forces during the IC/panel compressing step. The compressive force ruptures a thin, electrically insulating membrane which covers each of the spheres 51a, thus, allowing those spheres 51a to electrically connect the terminal pads 14 with the bumps 22. Adjacent bumps and terminal pads remain electrically isolated from one another as the spheres 51b located therebetween have not been compressed and remain electrically insulated from one another by their intact insulating membranes.

Figure 1B:
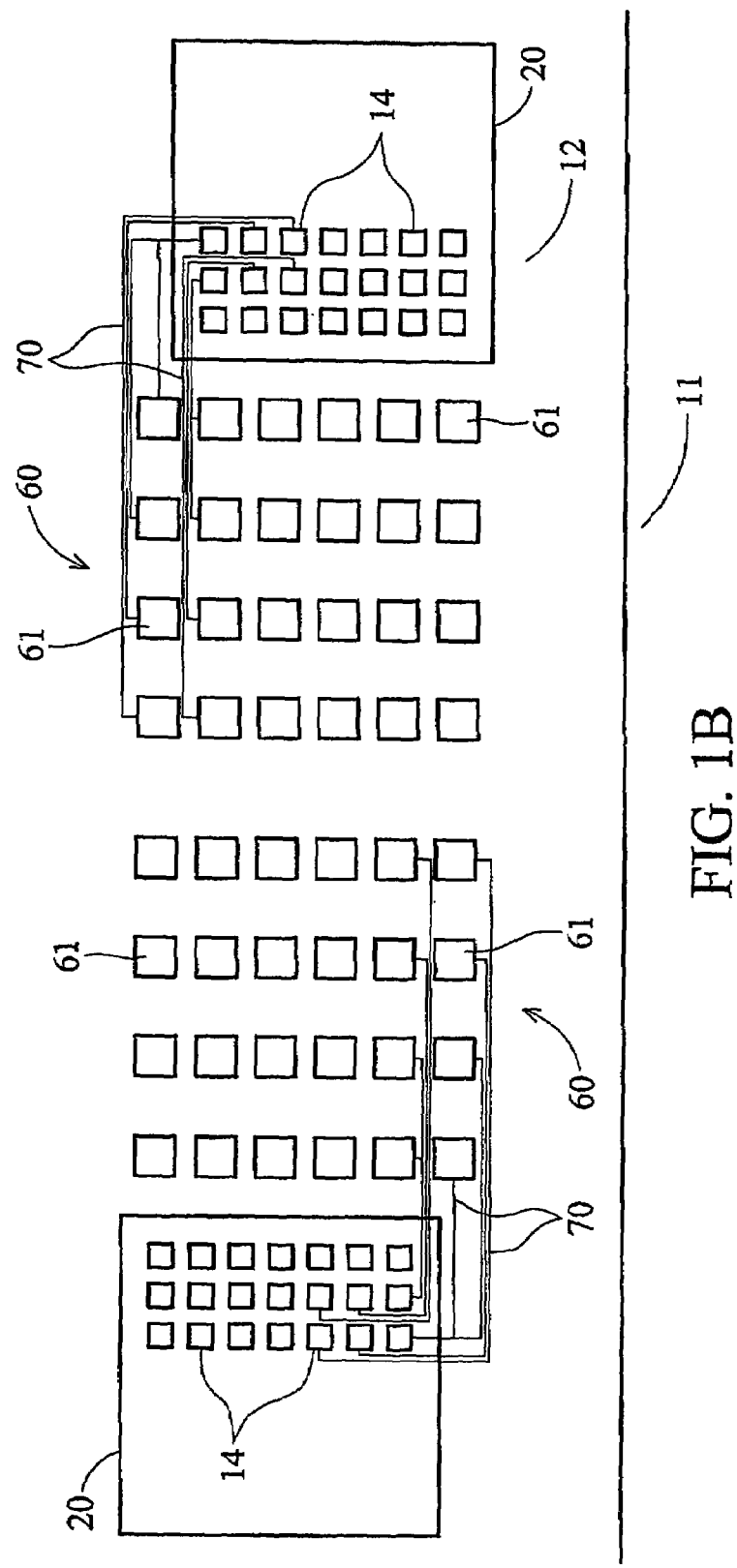
FIG. 1B is an enlarged view of the area of FIG. 1A encircled with broken line 1B.

Referring again to FIG. 1A and also to FIG. 1B, which is an enlarged view of encircled area of FIG. 1A, one or more test pad arrays 60 are disposed on the surface of the LCD panel 10 in the peripheral region 12, and more particularly, may be located in the space between adjacent pairs of driver ICs 20, in accordance with an embodiment of the invention. Each test pad array 60 includes one or more electrically conductive test pads 61. The test pads 61 are connected by electrically conductive lines 70 to the terminal pads 14 disposed beneath the ICs 20, on the surface of the panel 10 in the peripheral region. The test pads 61 and the lines 70 are formed from an electrically conductive material such as aluminum, using conventional deposition methods. Although the test pads 61 of the test pad arrays 60 depicted in FIGS. 1A and 1B are generally square in shape, the test pads 61 may also be formed in other shapes, including without limitation, rectangular, circular, and oval. The test pads 61 may have any desired dimension, although they are usually dimensioned to allow testing using conventional electrical probing techniques.

The test pad array 60 allows contact resistance measuring of the driver IC to panel ACF bonds. The contact resistance measurements obtained via the test pad array 60, can be used for archiving the effects of different bonding process conditions on the contact resistance of the ACF bonds. In addition, the test pad array 60 can be used to confirm electronic character functions of the driver ICs 20. This is useful when lead pitch or lead spacing changes or modifications are made. After testing has been completed, the test pad array 60 also functions to improve the adhesion of ACFs applied later on to the panel 10 in the manufacturing process.

Figure 5:
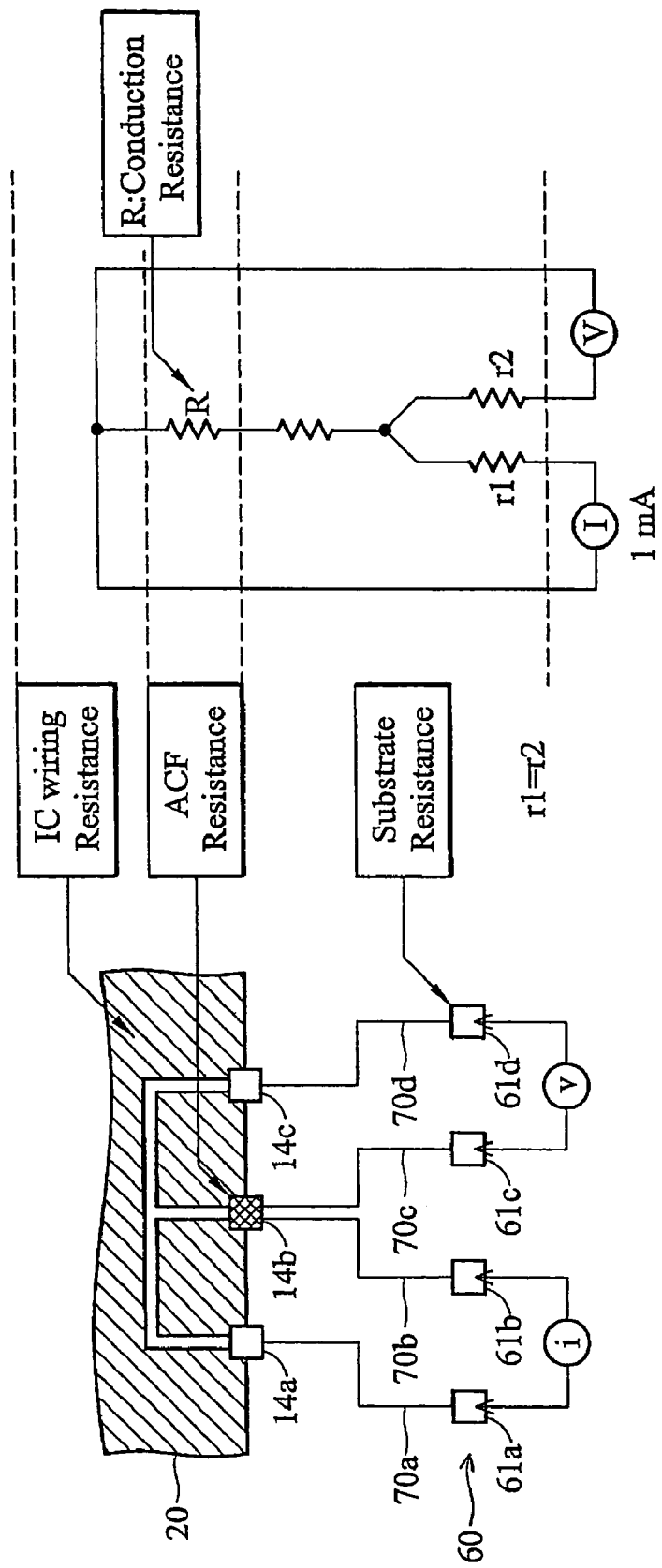
FIG. 5 is a diagram illustrating the use of the test pad array of the present invention to perform a conventional four point test method to obtain ACF bond contact resistance measurements.

FIG. 5 depicts the use of the test pad array 60 to perform a conventional four point test method to obtain ACF bond contact resistance measurements. The contact resistance R of the ACF bond electrically connecting one of the bumps (not shown) of the IC 20 with terminal pad 14b, may be obtained using four test pads 61a–d of the test pad array 60, wherein test pad 61a is electrically connected by line 70a to terminal pad 14a, test pads 61b and 61c are electrically connected by lines 70b and 70c to terminal pad 14b and test pad 61d is electrically connected by line 70d to terminal pad 14C. The contact resistance R of this ACF bond can be obtained by applying a given voltage to test pads 61c and 61d and measuring the current at test pads 61a and 61b.

Figure 6A:
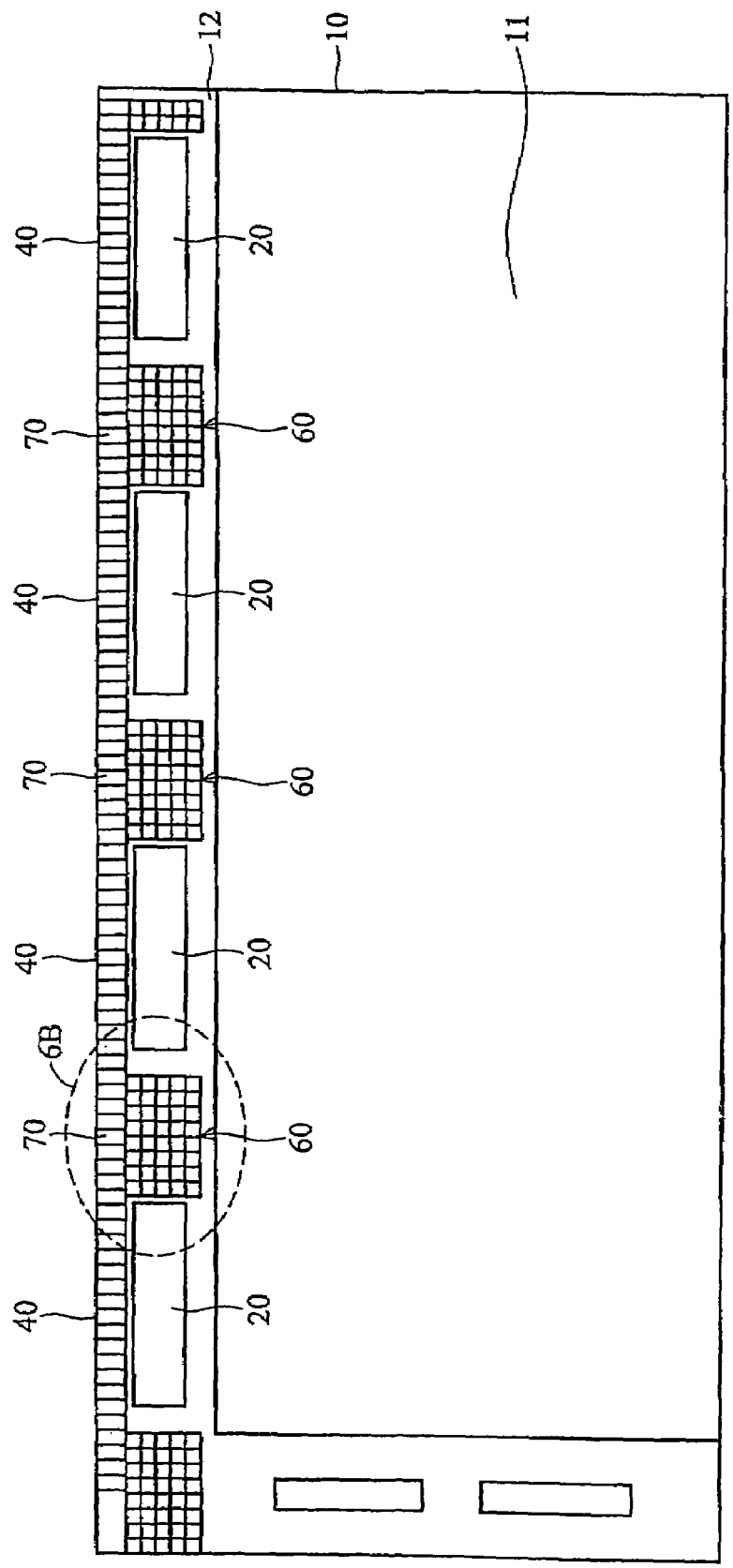
FIG. 6A is a plan view of an illustrative embodiment of an LCD panel which utilizes a test pad array and a dummy lead array.
Figure 6B:
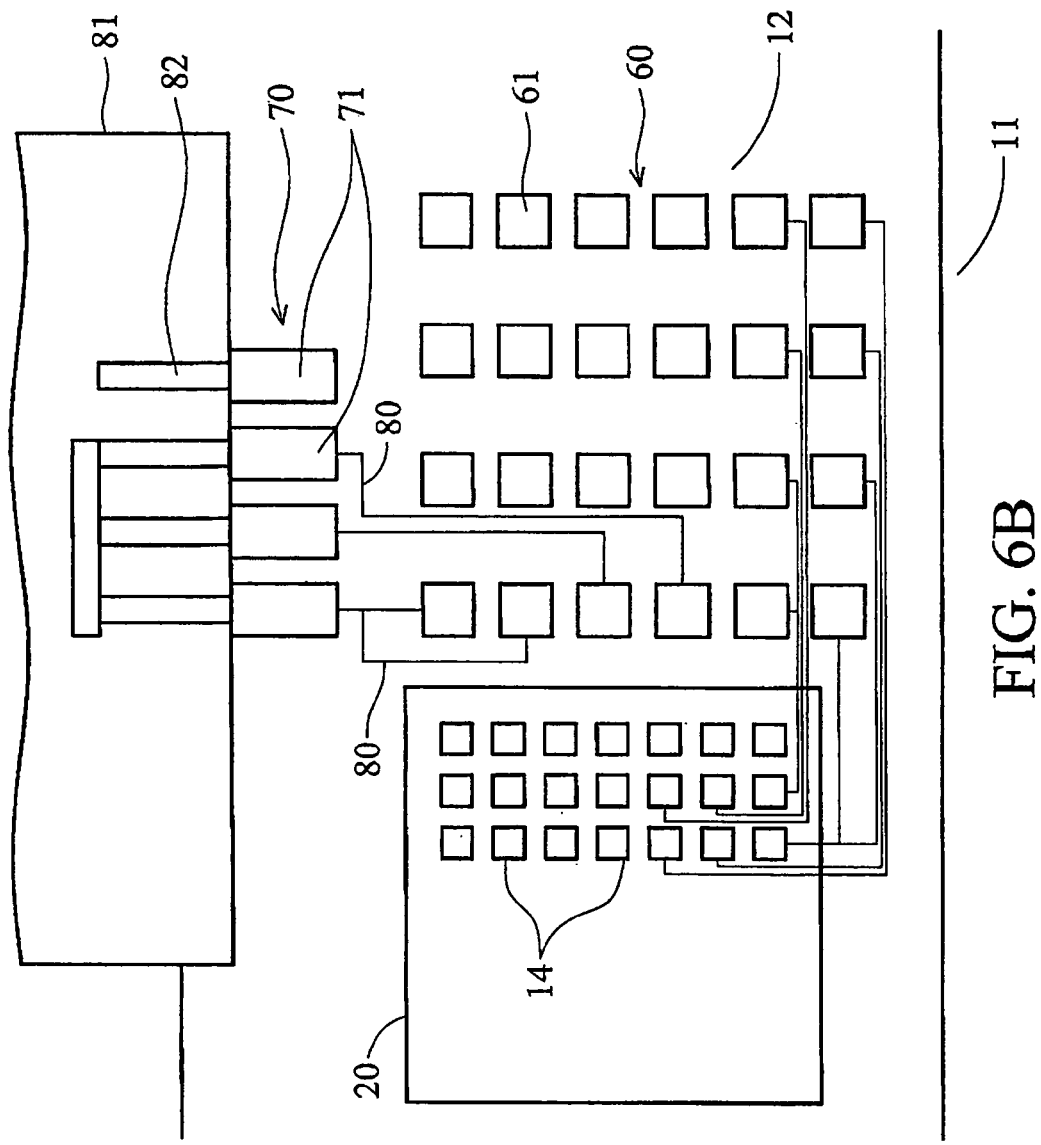
FIG. 6B is an enlarged view of the area of FIG. 6A encircled with broken line 6B.

As shown in FIGS. 6A and 6B, in addition to the test pad arrays 60, one or more dummy lead arrays 70 may be provided on the peripheral surface region 12 of the LCD panel 10, in the space between the terminal leads 40. Each dummy lead array 70 includes one or more dummy leads 71 which may be connected by electrically conductive lines 80, disposed on the surface of the LCD panel 10 in the peripheral region 12, to test pads 61 of an associated test pad array 60, which are not connected to the driver IC terminal pads 14. The dummy leads 71 allow a device 81, such as a FPC (shown), a tape-carrier-package (TCP) or a chip-on-film (COF) to be electrically connected to the panel 10. As shown in FIG. 3, an ACF electrically connects electrical leads 82 (FIG. 6B), which are on the bottom of the device 81 to the dummy leads 71. Although not shown, the leads 82 are electrically connected to functional leads of device 81 that are ACF bonded, for example, to the terminal leads 40 of the panel 10 or terminal leads of a printed circuit board (PCB) 90, thus, allowing contact resistance testing of these ACF bond points.

The dummy leads 71 shown in FIG. 6B are generally rectangular in shape, however, the dummy leads 71 may also be formed in other shapes, including without limitation, square, circular, and oval. The dummy leads 71 and the lines 80 are formed from an electrically conductive material such as aluminum, for example, using conventional deposition methods. The dummy leads 71 may have any desired dimension, although they are usually dimensioned to allow testing using conventional electrical probing techniques.

While the foregoing invention has been described with reference to the above embodiments, various modifications and changes can be made without departing from the spirit of the invention. Accordingly, all such modifications and changes are considered to be within the scope of the appended claims.

What is claimed is:

1. A method for measuring anisotropic conductive film bond contact resistance on an liquid crystal display panel, the method comprising the steps of:
   providing a test pad array on a surface of the liquid crystal display panel;
   electrically connecting the test pad array to a group of terminal pads disposed on the surface of the panel, the group of terminal pads electrically connected to a first electronic device with anisotropic conductive film bonds; and
   measuring a contact resistance of at least one of the anisotropic conductive film bonds using the test pad array.

2. The method according to claim 1, wherein the test pad array is disposed in a peripheral region of the liquid crystal display panel.

3. The method according to claim 1, wherein the test pad array is disposed in a space next to the group of terminal pads.

4. The method according to claim 1, further comprising the steps of:
   providing a dummy lead array on the surface of the liquid crystal display panel, the dummy lead array electrically connecting a second electronic device to the panel;
   electrically connecting the dummy lead array to the test pad array; and
   measuring a contact resistance of at least one anisotropic conductive film bond associated with the second electronic device using portions of the test pad array electrically connected to the dummy lead array.

5. The method according to claim 4, wherein the first electronic device is selected from the group consisting of an integrated circuit chip, a flexible printed circuit, a tape-carrier-package and a chip-on-film.

6. The method according to claim 5, wherein the second electronic device is selected from the group consisting of an integrated circuit chip, a flexible printed circuit, a tape-carrier-package and a chip-on-film.

7. The method according to claim 4, wherein the second electronic device is selected from the group consisting of an integrated circuit chip, a flexible printed circuit, a tape-carrier-package and a chip-on-film.

8. The method according to claim 1, wherein the first electronic device is selected from the group consisting of an integrated circuit chip, a flexible printed circuit, a tape-carrier-package and a chip-on-film.

9. A liquid crystal display panel, comprising:
a panel;
a group of terminal pads disposed on a surface of the panel;
a first electronic device;
anisotropic conductive film bonds electrically connecting the first electronic device to the group of terminal pads;
a test pad array disposed on the surface of the panel, the test pad array electrically connected to the group of terminal pads;
wherein the test pad array allows contact resistance measuring of at least one of the anisotropic conductive film bonds.

10. The liquid crystal display panel according to claim 9, wherein the test pad array is disposed in a peripheral region of the panel.

11. The liquid crystal display panel according to claim 9, wherein the test pad array is disposed in a space next to the group of terminal pads.

12. The liquid crystal display panel according to claim 9, further comprising:
a dummy lead array disposed on the surface of the panel, the dummy lead array for electrically connecting a second electronic device to the panel, the dummy lead array electrically connected to the test pad array,
wherein the dummy lead array allows contact resistance measuring of at least one anisotropic conductive film bond associated with the second electronic device using portions of the test pad array electrically connected to the dummy lead array.

13. The liquid crystal display panel according to claim 12, wherein the first electronic device is selected from the group consisting of an integrated circuit chip, a flexible printed circuit, a tape-carrier-package and a chip-on-film.

14. The liquid crystal display panel according to claim 13, wherein the second electronic device is selected from the group consisting of an integrated circuit chip, a flexible printed circuit, a tape-carrier-package and a chip-on-film.

15. The liquid crystal display panel according to claim 12, wherein the second electronic device is selected from the group consisting of an integrated circuit chip, a flexible printed circuit, a tape-carrier-package and a chip-on-film.

16. The liquid crystal display panel according to claim 9, wherein the first electronic device is selected from the group consisting of an integrated circuit chip, a flexible printed circuit, a tape-carrier-package and a chip-on-film.

* * * * *